(12) United States Patent
Kang

(10) Patent No.: US 7,452,734 B2
(45) Date of Patent: Nov. 18, 2008

(54) METHOD OF MAKING A MONITORING PATTERN TO MEASURE A DEPTH AND A PROFILE OF A SHALLOW TRENCH ISOLATION

(75) Inventor: Jung Ho Kang, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 377 days.

(21) Appl. No.: 10/757,821

(22) Filed: Jan. 15, 2004

(65) Prior Publication Data

US 2004/0152220 A1 Aug. 5, 2004

(30) Foreign Application Priority Data

Jan. 30, 2003 (KR) .................. 10-2003-0006444

(51) Int. Cl.
*H01L 21/66* (2006.01)
*G01R 31/26* (2006.01)

(52) U.S. Cl. .................... 438/16; 438/17; 438/424; 257/E21.53; 257/E21.531

(58) Field of Classification Search ............. 438/179, 438/14, 424, 435, 585, FOR. 221, FOR. 228, 438/16–18, FOR. 227; 356/237.2–237.6; 257/E21.521, E21.529–E21.531
See application file for complete search history.

(56) References Cited

U.S. PATENT DOCUMENTS

| | | | |
|---|---|---|---|
| 4,364,010 A | | 12/1982 | Watari et al. |
| 5,770,490 A | * | 6/1998 | Frenette et al. ............. 438/199 |
| 5,902,752 A | * | 5/1999 | Sun et al. ..................... 438/692 |
| 6,204,073 B1 | * | 3/2001 | Nandakumar et al. ......... 438/17 |
| 6,350,994 B1 | * | 2/2002 | Chang et al. .................. 257/48 |
| 6,362,035 B1 | * | 3/2002 | Shih et al. ................... 438/199 |
| 6,642,076 B1 | * | 11/2003 | Yaung et al. .................. 438/48 |
| 6,650,424 B2 | * | 11/2003 | Brill et al. .................... 356/601 |
| 2002/0105041 A1 | * | 8/2002 | Goto et al. ................... 257/410 |
| 2003/0052084 A1 | * | 3/2003 | Tabery et al. ................. 216/59 |

FOREIGN PATENT DOCUMENTS

| | | |
|---|---|---|
| KR | 10-2000-0004100 | 1/2000 |
| KR | 10-2001-0001448 | 1/2001 |
| KR | 1003010400000 | 6/2001 |
| KR | 1020010053654 | 7/2001 |
| KR | 1020010066143 | 7/2001 |

\* cited by examiner

*Primary Examiner*—Michelle Estrada
*Assistant Examiner*—Quovaunda Jefferson
(74) *Attorney, Agent, or Firm*—Saliwanchik, Lloyd & Saliwanchik

(57) ABSTRACT

A method of making a monitoring pattern to measure a depth and profile of a shallow trench isolation is disclosed. An example method of making a monitoring pattern of a shallow trench isolation profile forms a first pattern on a substrate to monitor a depth of a first shallow trench isolation. In the example method, the first pattern includes a plurality of unequally spaced active regions on the substrate. The example method also forms a second pattern on the substrate to measure electrical effects associated with a depth and a profile of a second shallow trench isolation. In the example method, the second pattern includes a plurality of equally spaced active regions on the substrate and a plurality of contact regions that electrically connect the equally spaced active regions.

3 Claims, 1 Drawing Sheet

METHOD OF MAKING A MONITORING PATTERN TO MEASURE A DEPTH AND A PROFILE OF A SHALLOW TRENCH ISOLATION

FIELD OF THE DISCLOSURE

The present disclosure relates generally to semiconductor devices and, more particularly, to a method of making a monitoring pattern to measure a depth and a profile of a shallow trench isolation.

BACKGROUND

There are two traditional methods for making monitoring patterns. One method is based on the well known in-line monitoring pattern and the other method is based on the well known unit device monitoring pattern. Both of these known methods are generally used to confirm critical dimensions (hereinafter referred to as "CD") and depth.

In a method for in-line monitoring pattern, as described in Korean Patent Registration No. 0301040, electronic beams are applied to a semiconductor substrate having an open pad composed of an impurities-doped poly-silicon layer formed in an in-line during the fabrication of semiconductor device. In response to the application of the electronic beams, the secondary electrons emitted from the pad are imaged as black or white.

A conventional method for measuring the depth of shallow trench isolation (STI) is disclosed in Korean Patent Publication No. 2001-0066143. A trench and an insulating layer respectively having a length of 0.4 micrometer are alternately provided to form a pattern in the shape of a lattice. An indicating value of nanospec is set according to a depth of the trench, which is detected in a constant frequency band corresponding to a thickness of the insulating layer. Then, a laser beam is scanned on the pattern in the shape of a lattice using a nanospec device to detect the indicated value in the desired frequency band. Then, the indicated value is calculated in terms of a thickness.

Another method for forming patterns for measuring an STI profile is disclosed in Korean Patent Registration No. 0316054. With this method, a test pattern is formed that has many bar patterns with regular width to form an isolation layer of a device to define an active region. A process is then monitored by measuring the degree of protrusion or sinking of the isolation layer of the device via detecting the difference between the width of the active region and the width of the isolation layer of the device by using Atomic Force Microscope (AFM) equipment.

Further, U.S. Pat. No. 6,350,994 discloses a structure of CD bar. The CD bar is formed on a substrate between dies. A base layer is formed on a portion of the substrate. A critical material layer is then formed on the die, the base layer and the substrate with a uniform thickness. The base layer has a thickness that provides a surface profile the same as the die. A die photomask pattern and first and a second test photomask patterns on a photomask are then transferred to the critical material on dies, the base layer, and the substrate, respectively. These three photomask patterns have the same pattern width.

Still further, U.S. Pat. No. 4,364,010 discloses a semiconductor device with a monitor pattern and a method for monitoring device parameters. The monitor pattern comprises a semiconductor layer, a first region, a second region, and a third region. The first region is formed in the semiconductor layer. The second region is formed within the first region so that the surface of the first region is divided into two portions. The third region is formed in the semiconductor layer and electrically connected to the substrate. One of the two portions of the first region is electrically connected to the third region. As the second region becomes deeper, the connection (lying beneath the second region) that connects the two portions of the first region becomes thinner. As this connection becomes thinner, its resistance is increased. Thus, monitoring of resistance between the two portions of the first region provides an index of the depth of the second region, and thereby doping profile changes during manufacture.

With the conventional methods described above, it is possible to measure CD and depth and forming a monitoring pattern of a unit device such as a transistor and a diode. However, there remains a difficulty in forming a monitoring pattern of composite devices.

As the technology of fabricating semiconductor develops, chip sizes decrease, the line width of circuits becomes thinner, and composite devices become more prevalent. Therefore, known methods of using an in-line monitoring pattern and unit device monitoring pattern will soon reach their technological limits.

DETAILED DESCRIPTION

Figure 1:
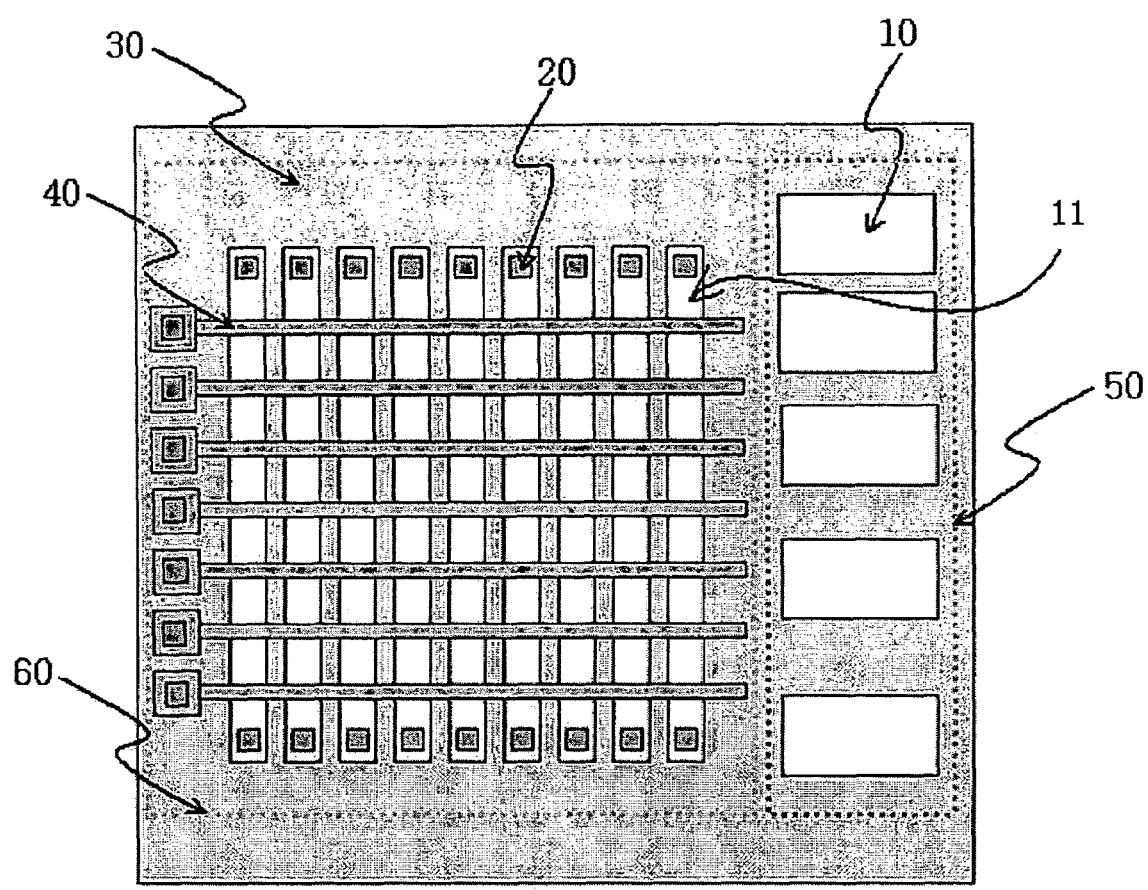
FIG. 1 illustrates an example pattern for monitoring the effects on devices according to the depth and profile of shallow trench isolation.

As described in greater detail herein, a monitoring pattern of a shallow trench isolation (STI) profile measures the effects on a device according to the depth and profile of STI by forming a pattern for the STI profile and a pattern for monitoring the depth of the STI.

In particular, an example method of making a monitoring pattern of an STI profile to confirm the effects on devices according to the depth and profile of the STI forms a first pattern for monitoring the depth of the STI. The first pattern has a plurality of active regions with unequal spacing on the substrate. A second pattern is formed to measure electrical effects by the depth and profile of the STI. The second pattern has a plurality of active regions on the substrate and a plurality of contact regions for electrical interconnections between the equally spaced active regions.

In general, the examples described herein relate to a monitoring pattern of an STI profile and to a method for forming a pattern which can monitor very small differences between the depths of the trench insulating layers in an STI structure. With conventional technology, STI profile monitoring is typically performed for patterns of about 100 μm. However, due to the proliferation of more highly integrated devices and the fact that post-processes and electrical effects on devices can be adversely affected by finer STI profiles, the methods disclosed herein may be particularly useful in alleviating these adverse affects.

A typical STI insulating layer relates to an oxide layer that is formed by the following processes. First, a trench is formed to separate active regions on the semiconductor substrate. Second, the inside of the trench is filled with a gap filling oxide layer. Then, etching and planarization processes are performed. A significant difference between the depths of the insulating layers in the STI structure causes several problems. If the insulating layer is substantially higher than the surface of the active region, a spacer of a word line formed in the edge of the insulating layer when the next word line is defined may result in a short between the word lines.

On the other hand, if the insulating layer is substantially lower than the surface of the active region, a large area of the side surface of the active region may be exposed. The exposed area forms a parasitic transistor, lowers the threshold voltage, increases the leakage current, and generally degrades the performance characteristics of the semiconductor device.

Consequently, it is desirable to control precisely the thicknesses of the insulating layers on the active region. It is a critical factor in improving the yield of a device to monitor precisely the heights of the insulating layers compared with those of the active regions.

FIG. 1 illustrates an example pattern for monitoring the effects on devices according to the depth and profile of a STI. The example monitoring pattern of an STI profile described herein is divided into two parts: a pattern for monitoring depth of a STI 50 and a pattern for measuring electrical effects on a semiconductor device by the depth and profile of a STI 60.

First, for the pattern for monitoring the depth of the STI 50, non-trench-etched active regions 10 are formed. The space between the active regions in the pattern for monitoring depth after the STI 50 is formed with unequal spacing to monitor precisely while sampling a pattern for measuring electrical effects by the depth and profile of the STI 60. Next, the pattern for measuring electrical effects by the depth and profile of the STI 60 is formed as described below. First, a plurality of non-trench-etched active regions 11 is formed. The spacing between the active regions 11 is preferably equal. Second, trench-etched regions 30 are formed. Third, a plurality of contact regions 20 for electrical interconnections between the active regions 11 is formed. Finally, a plurality of gates 40 for the transistor generation is formed.

An example monitoring pattern of an STI profile may be embodied as depicted in the example structure of FIG. 1. With this monitoring pattern, the depth and profile of STI may be monitored and the effects on a device after STI etching according to density and size of the pattern may be determined. In addition, the depth and profile of STI can be monitored in a single monitoring pattern and the STI profile can be monitored by measuring the width and depth of slope with a SEM (Scanning Electron Microscope).

Thus, the example monitoring pattern of STI profile described herein is generally divided into two parts: a pattern for monitoring the depth of the STI 50 and a pattern for measuring electrical effects by the depth and profile of the STI 60. With this monitoring pattern, depth and profile of STI may be monitored and the effects on a device may be determined. Those having ordinary skill in the art will readily appreciated that the examples described herein may be advantageously applied in semiconductor device fault analysis and research and development of semiconductor devices.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A method of making a monitoring pattern of a shallow trench isolation profile, comprising:

forming a first pattern on a substrate to monitor a depth of a first shallow trench isolation, and wherein the first pattern includes a plurality of active regions on the substrate, wherein distances between the plurality of active regions are unequally spaced, wherein active regions of the plurality of active regions are of the same size; and forming a second pattern on the substrate to measure electrical effects associated with a depth and a profile of a second shallow trench isolation, wherein the second pattern includes a plurality of equally spaced active regions on the substrate, a plurality of contact regions that electrically connect the equally spaced active regions, and a plurality of gates that are formed on the equally spaced active regions, wherein the gates do not contact the first pattern.

2. The method as defined by claim 1, wherein the depth, the profile and the electrical effects are monitored according to density and size of the first and second patterns.

3. The method as defined by claim 1, wherein the depth and the profile are monitored using a single monitoring pattern.

* * * * *